(12) United States Patent
Wang et al.

(10) Patent No.: US 9,923,040 B2
(45) Date of Patent: Mar. 20, 2018

(54) ARRAY SUBSTRATE AND DISPLAY DEVICE

(71) Applicants: BOE TECHNOLOGY GROUP CO., LTD., Beijing (CN); Chengdu BOE Optoelectronics Technology Co., Ltd., Chengdu, Sichuan (CN)

(72) Inventors: Jing Wang, Beijing (CN); Wei He, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/110,565

(22) PCT Filed: Jan. 5, 2016

(86) PCT No.: PCT/CN2016/070097
§ 371 (c)(1),
(2) Date: Jul. 8, 2016

(87) PCT Pub. No.: WO2017/004969
PCT Pub. Date: Jan. 12, 2017

(65) Prior Publication Data
US 2017/0148858 A1    May 25, 2017

(30) Foreign Application Priority Data
Jul. 7, 2015   (CN) .......................... 2015 1 0393988

(51) Int. Cl.
*H01L 27/32*        (2006.01)
*H01L 29/417*       (2006.01)
(Continued)

(52) U.S. Cl.
CPC ........ *H01L 27/3262* (2013.01); *H01L 27/124* (2013.01); *H01L 27/1222* (2013.01); *H01L 27/1251* (2013.01); *H01L 27/3276* (2013.01)

(58) Field of Classification Search
CPC ......... H01L 29/41733; H01L 29/42384; H01L 29/78696; H01L 27/1255; H01L 29/7869
(Continued)

(56) References Cited

U.S. PATENT DOCUMENTS

2005/0041169 A1*  2/2005  Hashimoto ........... G02F 1/1368
                                                        349/43
2005/0179036 A1*  8/2005  Yamazaki ........... H01L 27/1292
                                                        257/66
(Continued)

FOREIGN PATENT DOCUMENTS

CN    102800692 A    11/2012
CN    104600124 A     5/2015
(Continued)

OTHER PUBLICATIONS

Machine Translation of KR 100767631 B1.*
(Continued)

*Primary Examiner* — Kimberly Rizkallah
*Assistant Examiner* — Brian Turner
(74) *Attorney, Agent, or Firm* — Nath, Goldberg & Meyer; Joshua B. Goldberg

(57) ABSTRACT

The present invention relates to an array substrate and a display device. The array substrate comprises a first thin film transistor arranged on a non-display area of the array substrate and a second thin film transistor arranged on a display area of the array substrate, a part of a first active layer corresponding to a region between a first source and a first drain in the first thin film transistor forms a first trench, and a part of a second active layer corresponding to a region (Continued)

between a second source and a second drain in the second thin film transistor forms a second trench, the first trench has at least one first bent portion, the second trench has a second bent portion, and bending angles of the first bent portion and the second bent portion are the same or explementary angles.

18 Claims, 4 Drawing Sheets

(51) Int. Cl.
*H01L 29/786* (2006.01)
*G02F 1/1368* (2006.01)
*G02F 1/1362* (2006.01)
*H01L 27/12* (2006.01)

(58) Field of Classification Search
USPC .............................................. 257/59, 72, 77
See application file for complete search history.

(56) References Cited

U.S. PATENT DOCUMENTS

2007/0087495 A1   4/2007   Lai
2013/0328069 A1 * 12/2013  Yang ................. H01L 29/41733
                                                            257/88
2015/0144950 A1   5/2015   Kang et al.
2016/0351670 A1  12/2016   Li et al.

FOREIGN PATENT DOCUMENTS

| CN | 104916651 A | 9/2015 |
| KR | 2002-0096228 A | 12/2002 |
| KR | 100767631 B1 * | 10/2007 |
| KR | 10-2012-0052716 A | 5/2012 |

OTHER PUBLICATIONS

Written Opinion of the International Searching Authority dated Apr. 13, 2016 corresponding to International application No. PCT/CN2016/070097.

International Search Report dated Apr. 13. 2016 corresponding to International application No. PCT/CN2016/070097.

Office Action dated May 31, 2016 issued in corresponding Chinese Application No. 201510393988.7.

* cited by examiner

ARRAY SUBSTRATE AND DISPLAY DEVICE

This is a National Phase Application filed under 35 U.S.C. 371 as a national stage of PCT/CN2016/070097, filed Jan. 5, 2016, an application claiming the benefit of Chinese Application No. 201510393988.7, filed Jul. 7, 2015, the content of each of which is hereby incorporated by reference in its entirety.

FIELD OF THE INVENTION

The present invention relates to the field of display technology, and particularly, relates to an array substrate and a display device.

BACKGROUND OF THE INVENTION

In a tablet display device, thin film transistors (TFTs) arranged in matrix and a driving chip for driving the thin film transistors are generally provided on an array substrate, in order to control every pixel. In general, the thin film transistors are formed in a display area by a patterning process, and the driving chip is bonded in a non-display area.

With the development of display technology, GOA (Gate on Array) technique has been developed, that is, a gate driving circuit in the array substrate is integrated on a base substrate to drive pixels in a scanning manner. The gate driving circuit is formed by thin film transistors, and can be formed by a patterning process like the thin film transistors in the display area. Compared with the traditional bonding process of the driving chip, the bonding with respect to the GOA chip (integrated gate driving chip) is omitted, which can not only save cost, but also facilitate improving capacity due to the omission of bonding process in the gate line direction, and thus the GOA technique is widely applied in thin film transistors in the non-display area of the tablet display device.

A thin film transistor generally includes a gate G, a source S, a drain D and a semiconductor layer. Currently, the structure of the GOA thin film transistor in the non-display area differs from that of the pixel thin film transistor in the display area in that: a trench between the source and the drain of the GOA thin film transistor shown in FIG. 1 generally has a U-shaped structure, whereas a trench between the source and the drain of the pixel thin film transistor shown in FIG. 2 generally has a linear shape. In comparison, the trench between the source and the drain of the GOA thin film transistor is more space-saving, and is thus suitable for the non-display areas having limited space.

However, in forming the array substrate by a patterning process, in an exposing step, the entire substrate is exposed in a same exposure direction (X direction or Y direction according to the arrangement of the thin film transistors on the substrate), since the trench between the source and the drain of the GOA thin film transistor has a different shape from that of the trench between the source and the drain of the pixel thin film transistor, exposure in the GOA area and exposure in the pixel area are likely to be different (e.g., non-uniformity, some region in a trench is well exposed while another region is poorly exposed); accordingly, photoresist residues remain in a trench region between the source and the drain due to poor exposure in a developing step subsequent to the exposing step; as a result, incomplete etching of a metal film of the source and the drain occurs in the trench region between the source and the drain in the GOA area or the pixel area due to photoresist residues. Non-uniform exposure in any one of the GOA area and the pixel area will influence the characteristics of the thin film transistors, and influence the display quality of the product.

It can be seen that, it has become an urgent technical problem to standardize structures of thin film transistors in the non-display area and the display area so as to ensure that the thin film transistors having different structures in the above two areas have a same performance for exposing the trenches between the sources and the drains thereof during an patterning process.

SUMMARY OF THE INVENTION

In view of the above problem existing in the prior art, a technical problem to be solved by the present invention is to provide an array substrate and a display device, thin film transistors in a non-display area and a display area in the array substrate all have bent portions that are at least partially the same in shape, and thus have the same trench exposure performance between the sources and the drains thereof, thereby achieving better display quality.

A technical solution used to solve the technical problem of the present invention is an array substrate comprising a first thin film transistor and a second thin film transistor, the first thin film transistor is arranged on a non-display area of the array substrate, the second thin film transistor is arranged on a display area of the array substrate, a part of a first active layer corresponding to a region between a first source and a first drain in the first thin film transistor forms a first trench, and a part of a second active layer corresponding to a region between a second source and a second drain in the second thin film transistor forms a second trench, the first trench has at least one first bent portion, the second trench has a second bent portion; bending angles of the first bent portion and the second bent portion are the same, or, bending angles of the first bent portion and the second bent portion are explementary angles (a sum of the two bending angles is equal to 360 degrees).

Preferably, each first bent portion has a first part and a second part mirror symmetrical with respect to a first symmetry axis, the first part and the second part of the at least one first bent portion are arranged alternately; the second bent portion includes a third part and a fourth part mirror symmetrical with respect to a second symmetry axis, and the first symmetry axis and the second symmetry axis are in parallel. The first symmetry axis and the second symmetry axis may be parallel to a gate line of the second thin film transistor.

Preferably, the first source has a U-shaped structure, each of two sides of the U-shaped structure has at least one first corner each having the same shape, the number of the at least first corner of each side is the same, the first drain inserts into a recess of the U-shaped structure and has a second corner having the same shape as the first corner, the number of the second corner(s) is the same as that of the at least one first corner of one side of the U-shape structure, and an area between a first corner and the second corner opposite to the first corner forms the first bent portion;

the second drain has a third corner protruding outwardly, a part of the second source opposite to the third corner has a fourth corner matching the third corner in shape and recessed inwardly, and an area between the third corner and the fourth corner opposite to the third corner forms the second bent portion.

Preferably, each first corner is formed by two adjoining first line segments, each second corner is formed by two adjoining second line segments, an area between one first line segment forming the first corner and one second line segment opposite to said one first line segment and forming the second corner forms the first part, and an area between the other first line segment forming the first corner and the other second line segment opposite to said the other first line segment and forming the second corner forms the second part; and each third corner is formed by two adjoining third line segments, each fourth corner is formed by two adjoining fourth line segments, an area between one third line segment forming the third corner and one fourth line segment opposite to said one third line segment and forming the fourth corner forms the third part, and an area between the other third line segment forming the third corner and the other fourth line segment opposite to said the other third line segment and forming the fourth corner forms the fourth part.

Preferably, the first bent portion is chamfered; and the second bent portion is chamfered.

Preferably, the bending angles of the first bent portion and the second bent portion are in the range of 70 degrees to 110 degrees.

Preferably, the bending angles of the first bent portion and the second bent portion are both 90 degrees.

Preferably, the first source, the first drain, the second source and the second drain are formed by a same patterning process using a same material.

There is provided a display device, comprising the above array substrate.

The beneficial effects of the present invention are as follows: in the array substrate, since the trenches of the thin film transistors in the non-display area and the display area all have bent portions that are at least partially the same in shape, the exposure of photoresist can be more even during formation of source and drain electrodes by using a patterning process, and thus, the problem of photoresist residues at the trench between the source and the drain due to poor exposure can be avoided; accordingly, defective etching of the trench between the source and the drain due to poor exposure can be avoided in a subsequent etching process for forming a pattern including the source and the drain so as to form the trench between the source and the drain, thereby ensuring performance of the thin film transistors and improving quality of the array substrate product.

REFERENCE NUMERALS

11—first gate; 12—first source; 13—first drain; 14—first active layer; 15—first trench; 151—first part; 1510—first line segment; 152—second part; 1520—second line segment; 21—second gate; 22—second source; 23—second drain; 24—second active layer; 25—second trench; 251—third part; 2510—third line segment; 252—fourth part; 2520—fourth line segment; 26—pixel electrode; 27—gate line: 28—data line.

DETAILED DESCRIPTION OF THE EMBODIMENTS

To enable those skilled in the art better understand the technical solutions of the present invention, an array substrate and a display device of the present invention will be described in detail below with reference to the accompanying drawings and specific implementations.

Embodiment 1

This embodiment provides an array substrate, in which trenches between sources and drains of thin film transistors in both a display area and a non-display area are set to be at least partially the same in shape, so that exposure difference caused in an exposing step in a patterning process is greatly reduced, and non-uniform exposure is avoided, thereby ensuring performance of the thin film transistors and improving yield and performance of array substrates.

The concept of the present invention is not limited to the specific exemplary forms in the embodiments, for example, the trenches between the sources and the drains of the thin film transistors in the display area and the non-display area may have any other shape than V-shape, as long as the trench (first trench) in the non-display area and the trench (second trench) in the display area have geometrically similar shapes, and can have same or similar exposure performance.

Figure 3:
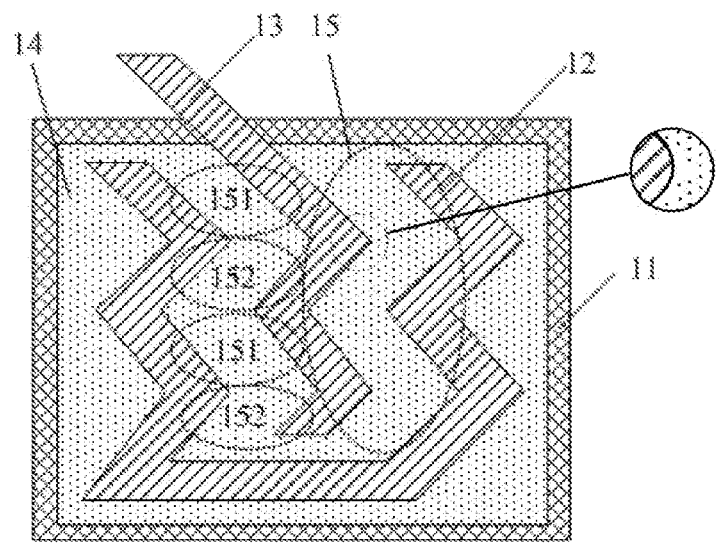
FIG. 3 is a structural schematic diagram of a thin film transistor in a GOA area in Embodiment 1 of the present invention.
Figure 4:
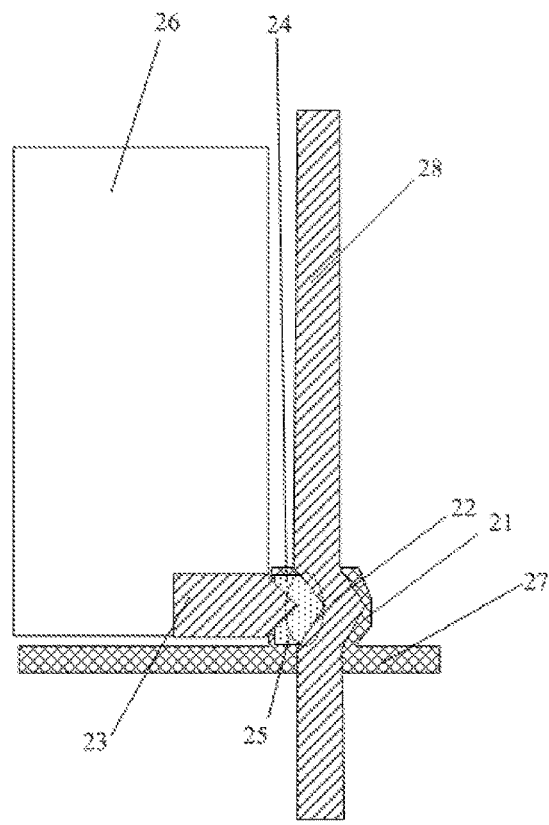
FIG. 4 is a structural schematic diagram of a thin film transistor in a pixel area in Embodiment 1 of the present invention.
Figure 5:
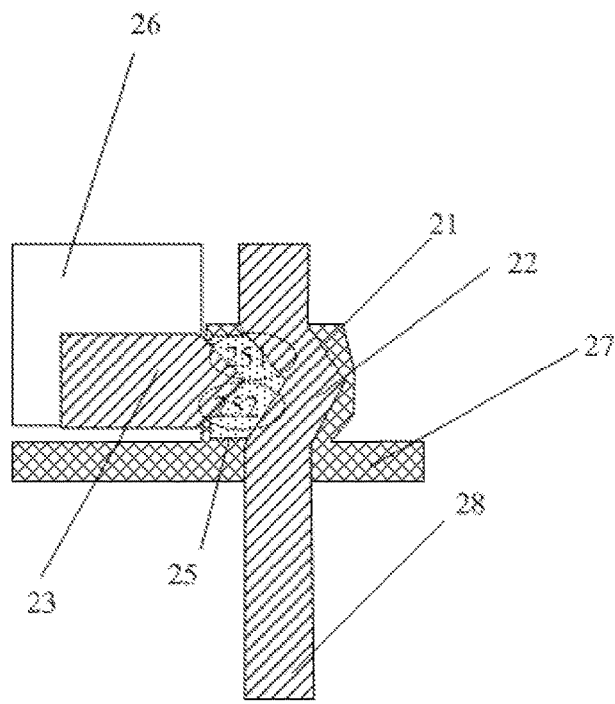
FIG. 5 is a partially enlarged view of FIG. 4.

As shown in FIGS. 3 to 5, the array substrate is divided into a display area provided with a first thin film transistor as shown in FIG. 4 and a non-display area provided with a second thin film transistor as shown in FIG. 3, a part of a first active layer 14 corresponding to a region between a first source 12 and a first drain 13 in the first thin film transistor forms a first trench 15, and a part of a second active layer 24 corresponding to a region between a second source 22 and a second drain 23 in the second thin film transistor forms a second trench 25, the first trench 15 and the second trench 25 have bent portions with the same shape. In the present inventive concept, the display area may include every pixel area, and the non-display area may include a GOA area.

Here, the first thin film transistor is provided in the non-display area, and is specifically provided in the GOA area, i.e., integrated in an area for driving a scanning on gate lines; the second thin film transistor is provided in the display area, and is specifically provided in an area corresponding to each display pixel, and thus the display area may also be referred to as a pixel area. Needless to say, the first thin film transistor further includes a first gate 11 therein, the second thin film transistor further includes a second gate 21 therein, which are not described in detail herein. In the second thin film transistor, the second gate 21 is electrically connected to a gate line 27, the second source 22 is electrically connected to a data line 28, the second drain 23 is electrically connected to the pixel electrode 26, so as to implement pixel display under the control of the thin film transistor.

In the array substrate of this embodiment, the first source 12 and the first drain 13 of the first thin film transistor and the second source 22 and the second drain 23 of the second thin film transistor are formed by a same patterning process using a same material. Accordingly, the first active layer 14 of the first thin film transistor and the second active layer 24 of the second thin film transistor are formed by a same patterning process using a same material. Here, the patterning process may include a photolithography process only, or include a photolithography process and an etching step. The photolithography process is a process including film application, exposure, development and other process procedures for forming a pattern using a photoresist, a mask, an exposure machine and the like.

Channel is a very important structure for a thin film transistor. The thin film transistor includes a semiconductor layer connected to both the source and the drain, of which a part between the separated source and drain becomes electrically conductive in its length direction under the action of electric field in a case where a turn-on voltage is applied to the gate, and at this point, the part of the semiconductor layer between the separated source and drain forms a channel. In this embodiment, the active layer in the region of the trench having the bent portion of the same shape forms a channel when the thin film transistor is turned on.

Specifically, in the process of forming a thin film transistor, generally, a pattern of an active layer (i.e., a semiconductor layer) at least corresponding to a source, a drain and gap area between the source and the drain is firstly formed, then a metal film of the source and the drain is formed on the pattern of the active layer, a photoresist layer is formed on the metal film of the source and the drain, next, the photoresist layer is exposed by an exposure process, and by a development process, only the photoresist corresponding to areas of the source and the drain is reserved while the photoresist corresponding to the gap between the source and the drain is removed; then, the metal film of the source and the drain that is not covered by the photoresist is removed by an etching process, so as to form the patterns of the source and the drain as well as the gap between the source and the drain, the gap herein being the trench in the embodiment which forms the channel of the thin film transistor under the action of an applied electric field.

In the array substrate of the embodiment, each first bent portion has a first part 151 and a second part 152 provided mirror symmetrical with respect to a first symmetry axis, the first part 151 and the second part 152 of the at least one first bent portion are arranged alternately, that is, in a case where there are a plurality of first bent portions, a preferred implementation is to connect the plurality of first bent portions in series, and the first parts and the second parts alternate with each other; the second bent portion includes a third part 251 and a fourth part 252 provided mirror symmetrical with respect to a second symmetry axis, and the first symmetry axis of the first bent portion and the second symmetry axis of the second bent portion are in parallel. In the first thin film transistor shown in FIG. 3, the first trench 15 has at least one first bent portion (the first trench 15 is shown in the form of the sum of the first parts 151 and the second parts 152 in the left of FIG. 3); in the second thin film transistor shown in FIG. 4, the second trench 25 has the second bent portion (the second trench 25 is shown in the form of the sum of the third part 251 and the fourth part 252 in FIG. 4). The term "mirror symmetrical" in the specification means that corresponding points of the first part 151 and the second part 152 in the first trench 15 has the same distance to the first symmetry axis, and the corresponding points of the third part 251 and the fourth part 252 in the second trench 25 have the same distance to the second symmetry axis, which not only can ensure that size and shape of the trench between the source and the drain are uniform, but also is conducive to practical manufacture and application.

Preferably, as shown in FIGS. 3 and 4, both the first symmetry axis and the second symmetry axis of the bent portions in the thin film transistor are parallel to a gate line. In general, scanning is performed in a direction parallel or perpendicular to the gate during an exposure process in a patterning process, the structure of the thin film transistor shown in FIG. 3 or 4 helps to ensure that the thin film transistors in the GOA area and the pixel area have the same exposure performance to photoresist when forming the trench regions between the sources and the drains, so that the subsequently formed trench regions have the same shape, thereby ensuring same performance of the thin film transistors in the GOA area and the pixel area.

In the array substrate of the embodiment, both the first source 12 and the first drain 13 are formed in a broken line (a V shape or a zigzag shape), each first bent portion includes a first part 151 and a second part 152, the first part 151 and the second part 152 are formed by intersecting (adjoining) line segments and form a broken line together; each of the second source 22 and the second drain 24 forms a broken line at least at an end portion or a branch or a corner thereof, the second bent portion includes a third part 251 and a fourth part 252, the third part 251 and the fourth part 252 are formed by two line segments forming the same corner. The term "broken line" or "line segment" in the specification presents a part, which is formed in a broken line or a line segment, of the source, the drain or the trench of the thin film transistor.

Specifically, in the thin film transistor in the non-display area as shown in FIG. 3, the first source has a U-shaped structure (a part of the first trench 15 corresponding to the bottom of the U-shaped source may be a straight portion), each of the two sides of the U-shaped structure has at least one first corner each having the same shape and has the same number of the first corner(s), the first drain inserts into recess of the U-shaped structure (i.e., one end of the first drain 13 is provided inside the U-shaped structure of the first source 12, and the other end thereof extends outside of the U-shaped structure) and has a second corner having the same shape as the first corner, the number of the second bent(s) is the same as that of the first corner(s) of one side of the U-shape structure, and an area between the first corner and the second corner opposite to the first corner forms the first bent portion. In the thin film transistor in the display area as shown in FIG. 4, the second drain has a third corner protruding outwardly, a part of the second source opposite to the third corner has a fourth corner matching the third corner in shape and recessed inwardly, and an area between the third corner and the fourth corner opposite to the third corner forms the second bent portion.

Figure 6:
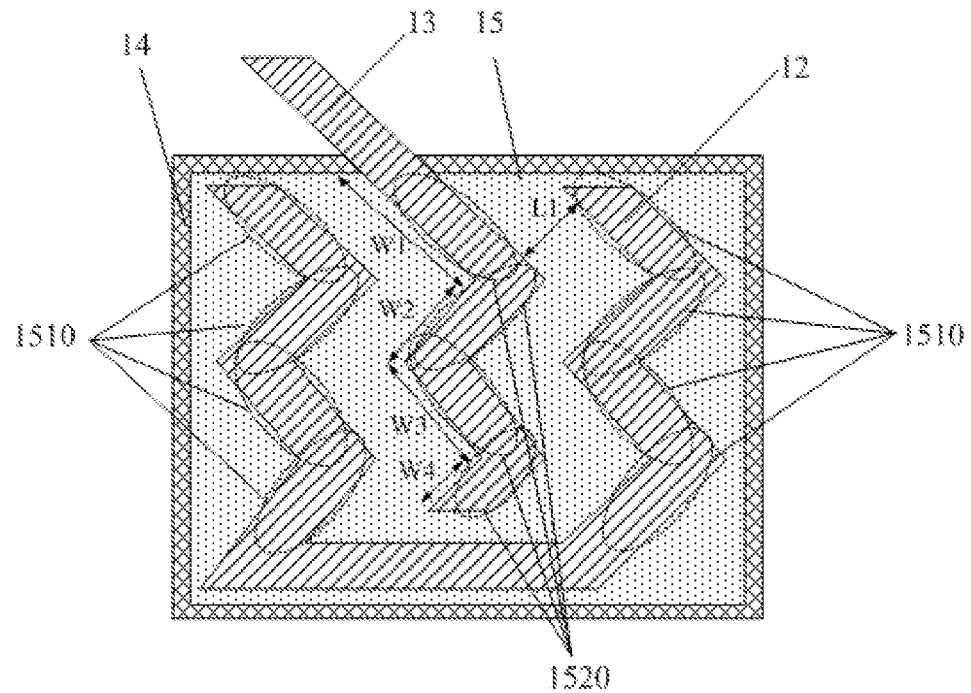
FIG. 6 is a schematic diagram indicating length and width of a trench in FIG. 3.
Figure 7:
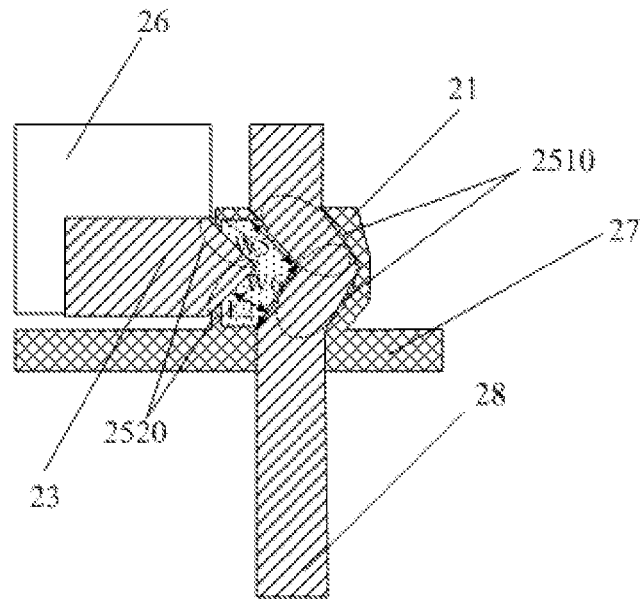
FIG. 7 is a schematic diagram indicating length and width of a trench in FIG. 4.

Referring to FIG. 6, each first corner is formed by two adjoining first line segments 1510, each second corner is formed by two adjoining second line segments 1520, the first part 151 is formed by an area between one first line segment 1510 forming the first corner and one second line segment 1520 opposite to said one first line segment 1510 and forming the second corner, and the second part 152 is formed by an area between the other first line segment 1510 forming the first corner and the other second line segment 1520 opposite to said the other first line segment 1510 and forming the second corner. Referring to FIG. 7, each third corner is formed by two adjoining third line segments 2510, each fourth corner is formed by two adjoining fourth line segments 2520, the third part 251 is formed by an area between one third line segment 2510 forming the third corner and one fourth line segment 2520 opposite to said one third line segment 2510 and forming the fourth corner, and the fourth part 252 is formed by an area between the other third line segment 2510 forming the third corner and the other fourth line segment 2520 opposite to said the other third line segment 2510 and forming the fourth corner.

In short, both the first source 12 and the first drain 13 in the first thin film transistor may be considered to include, in the vertical direction, a plurality of V-shapes having a certain degree, the first trench 15 defined by the first source 12 and the first drain 13 (the trench formed between the source and the drain of the first thin film transistor) is formed to have a plurality of V-shapes having a certain degree, the first bent portions include first parts 151 and the second parts 152 arranged alternately and formed, at two sides of the first drain 13, by two adjoining broken lines of the first source 12 and two adjoining broken lines of the first drain 13 opposite to the two adjoining broken lines of the first source 12; the second source 22 and the second drain 23 in the second thin film transistor adopt the similar design, so that the second trench 26 defined by the second source 22 and the second drain 23 (the trench formed between the source and the drain of the second thin film transistor) is also formed to have a V-shape having a certain degree, and the second bent portion includes the third part 251 and the fourth part 252 formed between the adjoining broken lines of the second drain 23 and the second source 22.

Here, in the non-display area, because the number of the first thin film transistors is large and the first thin film transistors are different in size, the number of the first bent portion(s) in each first thin film transistor may be different (the shape of each first thin film transistor depends on the size thereof and the size of the GOA area), but not limited to an odd number or an even number, for example, the number of the first bent portions may be three or four. In general, the more the bent portions, the larger the size of the thin film transistor and the larger the occupied area; in the pixel area, due to the limitations of size of the pixel area and aperture ratio, the second thin film transistor generally has only one second bent portion.

In FIGS. 3 to 5, the first bent portion and the second bent portion have the same bending angle. Needless to say, if the first part 151 of the first bent portion is considered as the second part 152 of an adjacent bent portion, and the second part 152 of the adjacent bent portion is considered as the first part 151 thereof, the bending angles of the first part and the second part are explementary angles, i.e., a sum of the bending angles of the first bent portion and the second bent portion is equal to 360 degrees).

Here, the bending angles of the first bent portion and the second bent portion are in the range of 70 degrees to 110 degrees. In order to obtain more uniform exposure in two directions perpendicular to each other, preferably, the bending angles of the first bent portion and the second bent portion are both 90 degrees. Because the symmetry axes of the bent portions in the thin film transistor are parallel to the gate line, same exposure performance to photoresist can be ensured for the thin film transistors during the formation of the trench regions between the sources and the drains, no matter whether scanning of the exposure process is performed in a direction parallel to the gate line or in a direction perpendicular to the gate line, so that the trench regions formed subsequently have the same shape, and thus same performance is ensured. Here, it focuses on ensuring the first bent portion and the second portion have the same bending angles, whereas any reasonable bending angle of the trench region between the source and the drain may be set flexibly according to practical effect of the patterning process, and is not limited herein.

In general, in the thin film transistors in FIGS. 3 and 4, the first bent portion and the second bent portion are chamfered, that is, a bent area of the first bent portion defined by the first corner and the second corner is chamfered; and a bent area of the second bent portion defined by the third corner and the fourth corner is chamfered. Preferably, a smooth angle is formed at the corner of the bent portion, so as to lower the requirements on the patterning process. Needless to say, the first bent portion and the second bent portion may be set to have sharp corners if it can be implemented under the process conditions, which is not limited herein.

Figure 1:
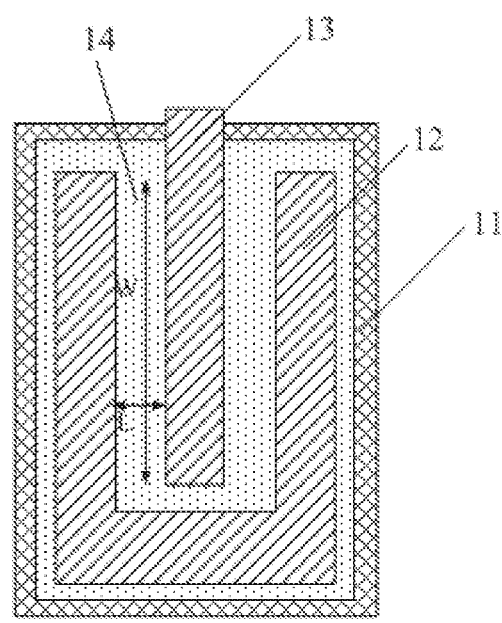
FIG. 1 is a structural schematic diagram of a thin film transistor in a GOA area in the prior art.
Figure 2:
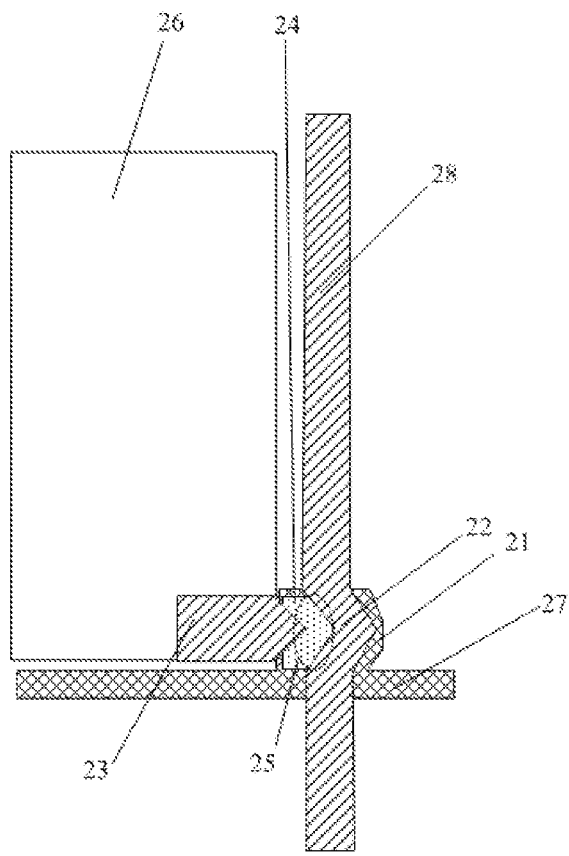
FIG. 2 is a structural schematic diagram of a thin film transistor in a pixel area in the prior art.

Compared with the thin film transistor in the prior art, the thin film transistor in the array substrate of the embodiment has a larger width to length ratio, and thus has better performance. In FIG. 1, a single trench between the source and the drain of the thin film transistor has a width of W and a length of L, and the directions of the W and L are perpendicular to each other. Referring to FIG. 6, a single trench between the source and the drain of the first thin film transistor in FIG. 3 has a width of |W1+W2+W3+W4| (i.e., total length of the broken lines in the vertical direction), wherein W<|W1+W2+W3+W4|, and has a length of L1 (i.e., vertical distance between parallel lines forming the bent portion). Similarly, referring to FIG. 7, the trench between the source and the drain of the second thin film transistor in FIG. 4 has a width of |W5+W6| (i.e., total length of the broken lines in the vertical direction), wherein W<|W5+W6|, and has a length of L2 (i.e., vertical distance between parallel lines forming the bent portion). According to the width to length ratio W/L, it can be known that the width to length ratio of the trench between the source and the drain of a thin film transistor in the non-display area in the present embodiment is larger than that in the prior art, and as the width to length ratio of the trench between the source and the drain increases, the threshold voltage Vth of the thin film transistor decreases, the drain current Id increases and the on-current Ion increases. Therefore, the on-current Ion of the thin film transistor increases due to the increase in the width to length ratio W/L of the trench between the source and the drain of the first thin film transistor in the non-display area in the present embodiment, thereby improving the characteristics of the thin film transistor.

The array substrate of the embodiment is applicable to typical tablet display device, such as a LCD display panel and an OLED display device. Generally, each pixel area of the LCD display device includes one second thin film transistor, and each pixel area of the OLED display device includes a driving circuit group formed by a plurality of the second thin film transistors. In the GOA area of the non-display area, both the LCD display device and the OLED display device include a plurality of the first thin film transistors.

Based on the above structure, in the array substrate, since the trenches of the thin film transistors in the non-display area and the display area all have bent portions that are at least partially the same in shape, it can be ensured that in an exposing step of a patterning process for forming the sources and the drains of thin film transistors, the thin film transistors in both the non-display area and the display area have the same exposure effect during the formation of the trench regions between the source and the drain thereof, no matter whether the exposure scanning is performed in X direction or Y direction, in other words, the photoresist for forming the source and drain electrodes of the thin film transistors in the non-display area and the display area are exposed more evenly, and thus the problem of photoresist residues at the trench between the source and the drain due to poor exposure can be avoided; accordingly, defective etching of the trench between the source and the drain due to poor exposure can be avoided in a subsequent etching process for forming a pattern including the source and the drain so as to form the trench between the source and the drain, thereby ensuring performance of the thin film transistors and improving quality of the array substrate product.

Embodiment 2

This embodiment provides a display device, comprising the array substrate in Embodiment 1.

The display device may be any product or component having a display function, such as a liquid crystal panel, an electronic paper, an OLED panel, a mobile phone, a tablet computer, a television, a display monitor, a notebook computer, a digital photo frame, a GPS or the like.

The display device uses the above array substrate and thus has a good display quality.

It could be understood that the above implementations are exemplary implementations used for describing the principle of the present invention only, but the present invention is not limited thereto. For those skilled in the art, various variations and modifications may be made without departing from the spirit and essence of the present invention, and these variations and modifications are also considered as falling into the protection scope of the present invention.

The invention claimed is:

1. An array substrate, comprising a first thin film transistor and a second thin film transistor, the first thin film transistor is arranged on a non-display area of the array substrate, the second thin film transistor is arranged on a display area of the array substrate, a part of a first active layer corresponding to a region between a first source and a first drain in the first thin film transistor forms a first trench, and a part of a second active layer corresponding to a region between a second source and a second drain in the second thin film transistor forms a second trench, and wherein an extending direction of the first trench and an extending direction of the second trench each forms an included angle with a direction of a gate line, each of the included angles is larger than 0 degree and less than 90 degree, the first trench has at least one first bent portion, the second trench has a second bent portion, and bending angles of the first bent portion and the second bent portion are the same or explementary angles.

2. The array substrate according to claim 1, wherein each first bent portion has a first part and a second part mirror symmetrical with respect to a first symmetry axis, and the second bent portion includes a third part and a fourth part mirror symmetrical with respect to a second symmetry axis, the first symmetry axis and the second symmetry axis being in parallel.

3. The array substrate according to claim 2, wherein the first source has a U-shaped structure, each of two sides of the U-shaped structure has at least one first corner each having the same shape, the number of the at least first corner of each side is the same, the first drain inserts into recess of the U-shaped structure and has at least one second corner each having the same shape as the first corner, the number of the at least one second corner is the same as that of the at least one first corner of a side of the U-shape structure, and an area between the first corner and the second corner opposite to the first corner forms the first bent portion; and the second drain has a third corner protruding outwardly, a part of the second source opposite to the third corner has a fourth corner matching the third corner in shape and recessed inwardly, and an area between the third corner and the fourth corner opposite to the third corner forms the second bent portion.

4. The array substrate according to claim 3, wherein each first corner is formed by two adjoining first line segments, each second corner is formed by two adjoining second line segments, the first part is formed by an area between one first line segment forming the first corner and one second line segment opposite to said one first line segment and forming the second corner, and the second part is formed by an area between the other first line segment forming the first corner and the other second line segment opposite to said the other first line segment and forming the second corner forms; and each third corner is formed by two adjoining third line segments, each fourth corner is formed by two adjoining fourth line segments, the third part is formed by an area between one third line segment forming the third corner and one fourth line segment opposite to said one third line segment and forming the fourth corner, and the fourth part is formed by an area between the other third line segment forming the third corner and the other fourth line segment opposite to said the other third line segment and forming the fourth corner.

5. The array substrate according to claim 3, wherein the first bent portion is chamfered; and the second bent portion is chamfered.

6. The array substrate according to claim 4, wherein the first bent portion is chamfered; and the second bent portion is chamfered.

7. The array substrate according to claim 1, wherein the bending angles of the first bent portion and the second bent portion are in the range of 70 degrees to 110 degrees.

8. The array substrate according to claim 7, wherein the bending angles of the first bent portion and the second bent portion are both 90 degrees.

9. The array substrate according to claim 1, wherein the first source, the first drain, the second source and the second drain are formed by a same patterning process using a same material.

10. A display device, comprising the array substrate according to claim 1.

11. The display device according to claim 10, wherein each first bent portion has a first part and a second part mirror symmetrical with respect to a first symmetry axis, and the second bent portion includes a third part and a fourth part mirror symmetrical with respect to a second symmetry axis, the first symmetry axis and the second symmetry axis being in parallel.

12. The display device according to claim 11, wherein the first source has a U-shaped structure, each of two sides of the U-shaped structure has at least one first corner each having the same shape, the number of the at least first corner of each side is the same, the first drain inserts into recess of the U-shaped structure and has at least one second corner each having the same shape as the first corner, the number of the at least one second corner is the same as that of the at least one first corner of a side of the U-shape structure, and an area between the first corner and the second corner opposite to the first corner forms the first bent portion; and the second drain has a third corner protruding outwardly, a part of the second source opposite to the third corner has a fourth corner matching the third corner in shape and recessed inwardly, and an area between the third corner and the fourth corner opposite to the third corner forms the second bent portion.

13. The display device according to claim 12, wherein each first corner is formed by two adjoining first line segments, each second corner is formed by two adjoining second line segments, the first part is formed by an area between one first line segment forming the first corner and one second line segment opposite to said one first line segment and forming the second corner, and the second part is formed by an area between the other first line segment forming the first corner and the other second line segment opposite to said the other first line segment and forming the second corner forms; and each third corner is formed by two adjoining third line segments, each fourth corner is formed by two adjoining fourth line segments, the third part is formed by an area between one third line segment forming the third corner and one fourth line segment opposite to said one third line segment and forming the fourth corner, and the fourth part is formed by an area between the other third line segment forming the third corner and the other fourth line segment opposite to said the other third line segment and forming the fourth corner.

14. The display device according to claim 12, wherein the first bent portion is chamfered; and the second bent portion is chamfered.

15. The display device according to claim 13, wherein the first bent portion is chamfered; and the second bent portion is chamfered.

16. The display device according to claim 10, wherein the bending angles of the first bent portion and the second bent portion are in the range of 70 degrees to 110 degrees.

17. The display device according to claim 16, wherein the bending angles of the first bent portion and the second bent portion are both 90 degrees.

18. The display device according to claim 10, wherein the first source, the first drain, the second source and the second drain are formed by a same patterning process using a same material.

* * * * *